United States Patent
Morisaki et al.

(10) Patent No.: US 7,704,556 B2
(45) Date of Patent: Apr. 27, 2010

(54) SILICON NITRIDE FILM FORMING METHOD

(75) Inventors: Hitoshi Morisaki, Tokyo (JP); Yasushi Kamiya, Tokyo (JP); Shuji Nomura, Tokyo (JP); Masahiro Totuka, Tokyo (JP); Tomoki Oku, Tokyo (JP); Ryo Hattori, Tokyo (JP)

(73) Assignee: Canon Anelva Corporation, Kawasaki-Shi, Kanagawa (JP)

( * ) Notice: Subject to any disclaimer, the term of this patent is extended or adjusted under 35 U.S.C. 154(b) by 290 days.

(21) Appl. No.: 11/764,745

(22) Filed: Jun. 18, 2007

(65) Prior Publication Data

US 2008/0020140 A1 Jan. 24, 2008

Related U.S. Application Data

(62) Division of application No. 10/419,958, filed on Apr. 22, 2003, now abandoned.

(30) Foreign Application Priority Data

Apr. 22, 2002 (JP) .............................. 2002-118773

(51) Int. Cl.
*C23C 16/34* (2006.01)
(52) U.S. Cl. ................. 427/255.394; 427/579
(58) Field of Classification Search .......... 427/255.393, 427/255.394, 578, 579
See application file for complete search history.

(56) References Cited

U.S. PATENT DOCUMENTS

| | | | |
|---|---|---|---|
| 4,416,863 A * | 11/1983 | Sato et al. ................... | 423/344 |
| 4,524,719 A | 6/1985 | Campbell et al. | |
| 4,539,933 A * | 9/1985 | Campbell et al. ............ | 118/719 |
| 4,545,327 A | 10/1985 | Campbell et al. | |
| 5,003,152 A * | 3/1991 | Matsuo et al. ......... | 219/121.59 |
| 5,085,887 A | 2/1992 | Adams et al. | |
| 5,108,792 A | 4/1992 | Anderson et al. | |
| 5,320,680 A | 6/1994 | Learn et al. | |
| 5,529,657 A * | 6/1996 | Ishii ...................... | 156/345.26 |
| 5,534,073 A * | 7/1996 | Kinoshita et al. ............ | 118/728 |
| 5,772,770 A * | 6/1998 | Suda et al. .................. | 118/719 |
| 5,951,774 A | 9/1999 | Shishiguchi et al. | |
| 6,092,486 A | 7/2000 | Mabuchi et al. | |
| 6,325,857 B1 | 12/2001 | Miyoshi | |
| 6,344,232 B1 | 2/2002 | Jones et al. | |

(Continued)

FOREIGN PATENT DOCUMENTS

EP  1 312 698  5/2003

(Continued)

OTHER PUBLICATIONS

Azimi-Nam, S., et al., "Electron spectroscopy of plasma-enhanced chemical vapour deposited silicon nitride films". Journal of Materials Science Letters 6 (1987) pp. 935-938.*

(Continued)

*Primary Examiner*—Bret Chen
(74) *Attorney, Agent, or Firm*—Buchanan Ingersoll & Rooney PC

(57) ABSTRACT

The silicon nitride film forming method deposits a silicon nitride film on the substrate surface by maintaining the heating element at a predetermined temperature and by decomposing and/or activating a raw material gas supplied from the gas supply system.

11 Claims, 2 Drawing Sheets

U.S. PATENT DOCUMENTS

| | | | |
|---|---|---|---|
| 6,486,083 B1 * | 11/2002 | Mizuno et al. | 438/794 |
| 7,011,866 B1 | 3/2006 | Yamanaka et al. | |
| 2005/0217225 A1 * | 10/2005 | Peng et al. | 55/474 |
| 2006/0051964 A1 * | 3/2006 | Xia et al. | 438/706 |
| 2009/0061651 A1 * | 3/2009 | Nakashima et al. | 438/791 |

FOREIGN PATENT DOCUMENTS

| | | |
|---|---|---|
| JP | 05-243167 | 9/1993 |
| JP | 06-248456 | 9/1994 |
| JP | 09-157832 | 6/1997 |
| JP | 10-083988 | 3/1998 |
| JP | 2000-073172 | 3/2000 |
| JP | 2000-299314 | 10/2000 |
| JP | 2002-075992 | 3/2002 |
| WO | WO 93/08596 * | 4/1993 |

OTHER PUBLICATIONS

R. Hattori et al., "Noise Reduction of pHEMTs with Plasmaless Sin Passivation by Catalytic CVD" GaAs IC Symposium 1997 at Anaheim pp. 78-80.
Chinese Office Action dated Mar. 20, 2006.
European Office Action dated Dec. 21, 2006.
Japanese Office Actions dated Jun. 6, 2006 and Jun. 19, 2007.
Taiwanese Office Action dated Jun. 21, 2004.

* cited by examiner

SILICON NITRIDE FILM FORMING METHOD

BACKGROUND OF THE INVENTION

1. Field of the Invention

The present invention relates to a silicon nitride film forming apparatus and forming method having excellent reproducibility of film thickness and film quality, and in particular to a silicon nitride film forming apparatus and forming method used for compound semiconductor devices such as HEMT (High Electron Mobility Transistor), HBT (Heterojunction Bipolar Transistor) and the like.

2. Related Art

Chemical vapor deposition methods, such as a thermal CVD method and a plasma CVD method, have been widely used for manufacturing semiconductor devices. However, as the higher integration and function of devices come to be requested, the damage caused by the plasma and processing temperature become serious problems. Under such circumstances, a Catalytic CVD (Cat-CVD) method, which is free of such problems and can form a high quality film, is paid much attention and studied as a practical film forming method for a variety of thin films (JP10-83988A).

This method is carried out using an apparatus in which a substrate holder 3 holding a substrate 7 and a heating element 4 made of refractory metal such as tungsten or the like are disposed facing each other in a vacuum vessel 1 having an exhaust port 2 and a gas introduction means 8, as shown in, for example, FIG. 3. First, the inside of the vacuum vessel is exhausted. The heating element is heated by supplying electric current from an external power source through a connection terminal 5, and maintained at a temperature of from about 1000° C. to 2000° C. Then, a raw material gas is introduced into the vacuum vessel from gas introduction means 8 and decomposed and/or activated on the surface of heating element and/or in the vicinity to begin the deposition of thin film on the substrate.

It was confirmed by applying this method to the formation of the silicon nitride passivation layer of, for example, a GaAs HEMT that the damage on substrate surface is reduced and the device manufactured has excellent dynamic characteristics (R. Hattori et al., Technical Digest of 19th Annual GaAs IC Symp., Anaheim, 1997, p. 78).

However, when the silicon nitride film was repeatedly formed on a number of substrates, the film quality and film thickness were found to vary from substrate to substrate, meaning that the device characteristic was not stably obtained.

Then, in order to clear up the cause, the present inventors have investigated the structure and arrangement of members in the apparatus, the conditions of film formation and pretreatment such as outgas treatment, the cleaning to remove films deposited on the inner surface of vacuum vessel and the like, and, as a result, found that the reproducibility of film quality and film thickness remarkably fluctuates, depending on the temperature and the configuration of a deposition shield plate which was placed to prevent the film deposition on the inner surface of vacuum vessel and make the maintenance easier. The deposition shield plate is generally connected to the vacuum vessel directly or indirectly in such apparatuses, and its temperature changes with the temperature of heating element. That is, the temperature rise and drop of deposition shield plate, together with vacuum vessel, repeatedly take place, corresponding to the start and stop of film formation. Therefore, the relation of the film quality and film thickness with the temperature of deposition shield plate was examined carefully to find that the reproducibility of film quality, film thickness and the like sharply changes with the temperature around the heating element and the substrate.

SUMMARY OF THE INVENTION

The present inventors have further investigated on the basis of the knowledge and discoveries mentioned above, and then completed this invention. An object of this invention is to provide a silicon nitride film forming apparatus and a forming method which makes possible the high reproducibility of film quality and/or film thickness.

A silicon nitride film forming apparatus of this invention comprises a heating element and a substrate, which are arranged in a vacuum vessel connected to a gas exhaust system and a gas supply system to deposit a silicon nitride film on said substrate surface by maintaining said heating element at a predetermined temperature and by decomposing or activating a raw material gas supplied from said gas supply system, and further comprises an inner wall which is arranged in said vacuum vessel surrounding said heating element and said substrate so as to form a film formation space, a gas introduction means to introduce the raw material gas to said film forming space, and at least one of a heating means and a cooling means of said inner wall arranged to control said inner wall to a predetermined temperature.

With such a configuration, the ambient temperature of heating element and substrate can be controlled to a predetermined temperature. Although the detailed reason is not clear at present, the desired film quality and thickness can be stably reproduced for a number of film formations.

The inner wall is preferably composed of a first inner wall and a second inner wall. In addition, the first inner wall and the second inner wall are connected to each other and supported at the connection portion. Thus, the inner wall can be substantially isolated thermally from the vacuum vessel.

Since both temperatures of the inner wall and the vacuum vessel can be independently controlled and the heat capacity of inner wall is small as compared with the vacuum vessel, the temperature of the inner surface of inner wall is controlled and maintained more uniformly. This further improves the stability of film quality and the uniformity of film thickness. Moreover, the amount of heat incident onto the inner wall varies with the distance from the heating element. Therefore, when a wire is, for example, rectangularly disposed or, for example, a rectangular plate is disposed as a heating element, the portion closer to the heating element (the portion facing the heating element and the portion close to the frame for holding the heating element) is heated to a higher temperature. Accordingly, at least the upper portion of inner wall which faces the substrate with the heating element in between is preferably curved toward the heating element so that each part of the inner surface of said inner wall receives nearly the same amount of heat radiation from said heating element. Furthermore, it is preferable to make the periphery of inner wall curved similarly at the substrate side. This makes it easier to control the temperature of inner wall and to make the temperature distribution uniform.

The cooling means of inner wall is an annular cooling mechanism attached on the connection portion, which prevents the inner wall from being overheated. The inner wall temperature will gradually rise as the result of the heat radiation from the heating element while the film formation is continuously and repeatedly carried out. However, the overheating of inner wall is efficiently prevented with the cooling mechanism and the inner wall is controlled to a desired temperature, which makes it possible to carry out stable film formations.

Furthermore, the gas introduction means is constructed so that the raw material gas is emitted toward the portion of inner wall, which faces the substrate. Thus, the stability of film quality and the uniformity of film thickness are improved.

A silicon nitride film forming method of this invention is characterized in that a heating element and a substrate are arranged in a vacuum vessel connected to a gas exhaust system and a gas supply system to deposit a silicon nitride film on said substrate surface by maintaining said heating element at a predetermined temperature and by decomposing and/or activating a raw material gas supplied from said gas supply system, wherein an inner wall is arranged in said vacuum vessel surrounding said heating element and said substrate so as to form a film formation space, said inner wall is controlled to a predetermined temperature, and the raw material gas is introduced into said film forming space to carry out the formation of the silicon nitride thin film. As mentioned above, the inner wall is preferably heated with a heating means disposed thereon, but may be heated using the radiant heat from the heating element.

In this invention, the raw material gas is preferably emitted toward the portion of inner wall facing the substrate and the pressure of the film formation space is preferably set to 0.1-10 Pa, which further improves the stability of film quality and uniformity of film thickness.

In these drawings, numeral 1 denote vacuum vessel; 2, exhaust port; 3, substrate holder; 4, heating element; 5, connection terminal; 6, shutter; 7, substrate; 8, gas introduction pipe; 9, inner wall; 10, flange portion; 11, heating means; 12, coolant passage; 13, cooling pipes; 20, film formation space; 100, silicon nitride film forming apparatus; 200, transfer chamber; 300, load lock chamber; and 400,400', gate valve.

DETAILED DESCRIPTION OF THE INVENTION

The embodiments will be described below to concretely explain the present invention.

Figure 1:
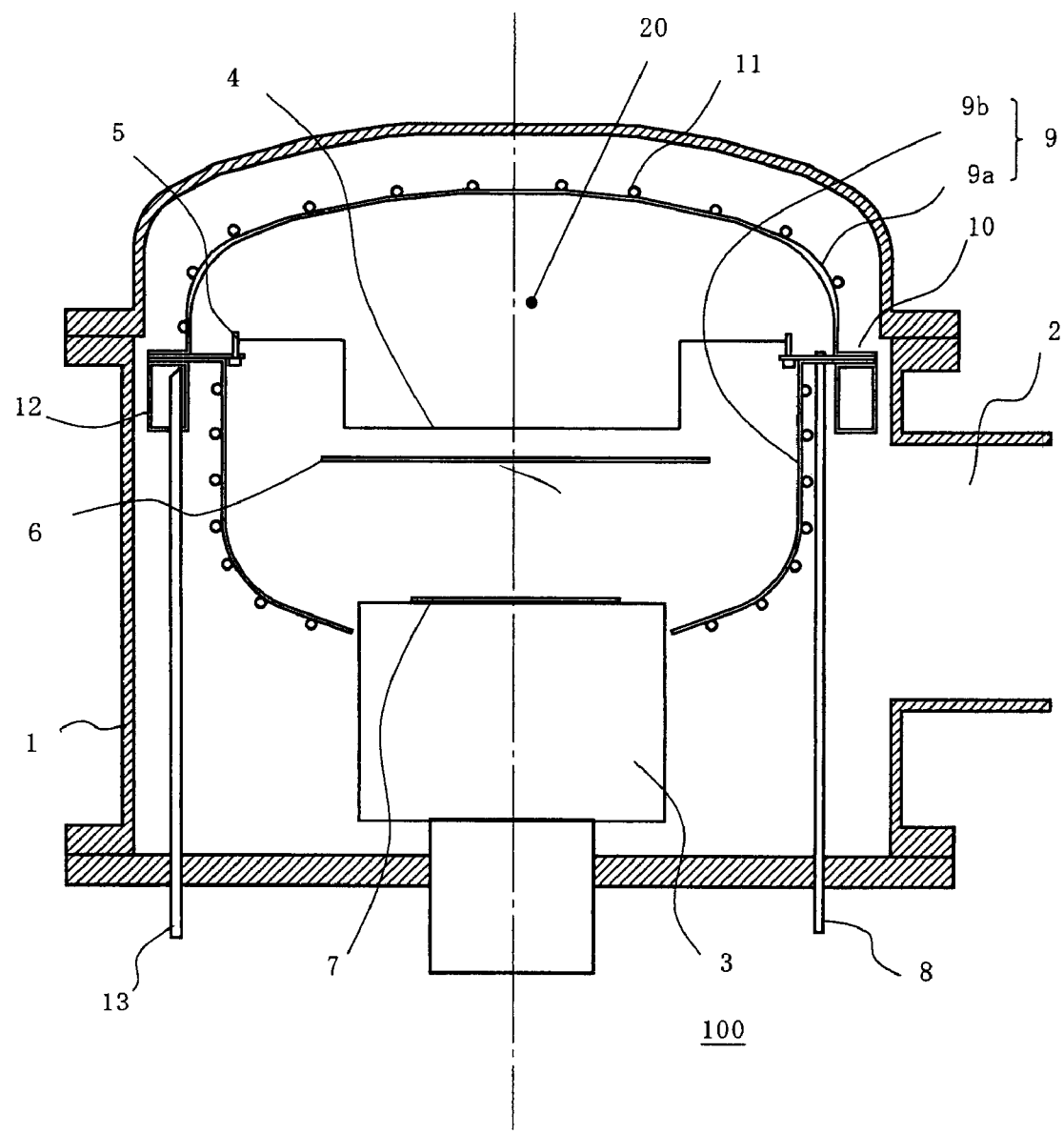
FIG. 1 is a sectional view showing an example of the silicon nitride film forming apparatuses of this invention.
Figure 2:
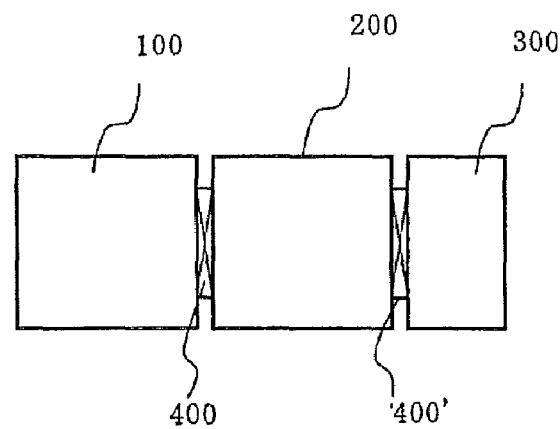
FIG. 2 is a schematic diagram showing an example of manufacturing apparatus.
Figure 3:
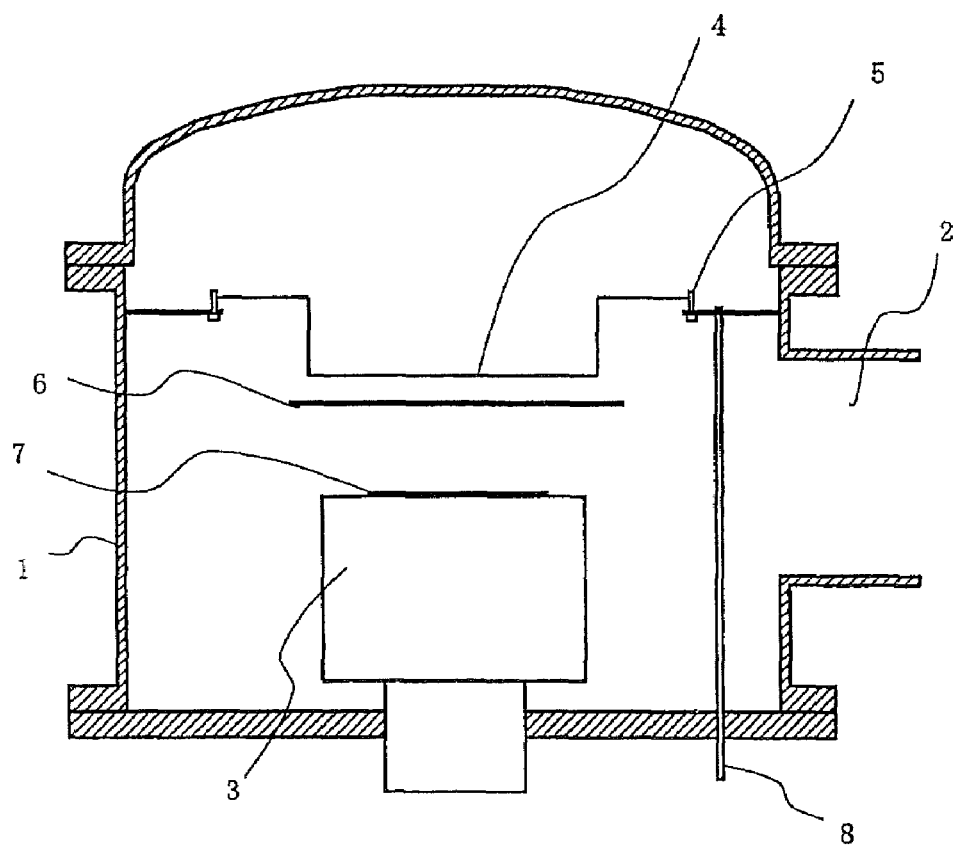
FIG. 3 is a sectional view showing a conventional silicon nitride film forming apparatus.

FIG. 1 is a sectional view showing an example of the silicon nitride film forming apparatuses of this invention, and FIG. 2 is a schematic diagram showing an example of manufacturing apparatus.

As shown in FIG. 1, a substrate holder 3 holding a substrate 7 and a heating element 4 above the substrate holder are arranged to be surrounded by an inner wall 9 in a vacuum vessel 1. Both of vacuum vessel 1 and inner wall 9 have a configuration to be divided into upper and lower portions (or before and behind portions) to make maintenance easier.

The inner wall 9 is composed of a first inner wall 9a and a second inner wall 9b which have a flange portion 10 to connect each other. A heating means of the inner wall (for example, sheath heater) 11 is attached on the outer surface of the first and second inner walls to heat the inner wall to a predetermined temperature. Furthermore, in the example of FIG. 1, an annular coolant passage 12 (a cooling means of the inner wall) is arranged to prevent the overheating of inner wall by the radiant heat from the heating element, and the flange portions 10 of inner walls are fixed thereon. A coolant is supplied into coolant passage 12 from outside through a cooling pipe 13, and then discharged. Thus, since the inner walls are supported at the flange portions 10, the inner walls which surround the heating element and the substrate are substantially isolated thermally from the vacuum vessel to efficiently control the temperature. Thus, the inner walls are connected to the vacuum vessel through the cooling means of the inner walls. Therefore, it becomes easier to control the temperature of the inner walls with a small heat capacity because they are thermally isolated from the vacuum vessel with a large heat capacity. In addition, the outgas from the surface of vacuum vessel is also reduced because the temperature rise of vacuum vessel due to the thermal conductance from the inner walls is suppressed.

A thermocouple (not illustrated) is attached on the first inner wall 9a around its central portion. Then, the electric current supplied to heating means 11 and the flow rate (or temperature) of coolant are adjusted, with the aid of the monitoring of the inner wall temperature, to maintain the inner wall at a desired temperature. That is, the ambient temperature of the heating element and the substrate can be maintained at a predetermined temperature during each film formation even for the case where the film formation is continuously repeated. Here, a radiation thermometer can also be employed instead of the thermocouple. Unlike the thermocouple, the radiation thermometer needs not to be detached from the inner wall when the maintenance is made. Furthermore, the temperature measurement may be made separately on the first and second inner walls, which makes the temperature distribution more uniform over the whole inner wall and the reproducibility of temperature control higher. The measurement position on the inner wall may be at least the position in the vicinity of the central axis in the horizontal direction of heating element, and/or preferably in the vicinity of the central axis in the vertical direction of heating element.

The inner wall 9 is preferably constructed to have a curved surface configuration so that each part of inner wall may receive nearly the same radiant heat from the heating element. It is also preferable to arrange heating means of inner wall 11 so as to uniformly heat the inner wall. In this embodiment, the inner wall is divided into upper and lower portions and is supported with a part of cooling mechanism. In addition, the inner wall may be connected with a small thermal contact or through a member having low heat conductivity so as to independently control the temperature of inner wall.

Furthermore, the gas introduction pipe 8 for supplying a raw material gas into a film formation space 20 is disposed to be connected to the external gas supply system (not illustrated).

The heating element which is comprised of refractory metal such as a tungsten, molybdenum, tantalum or the like is disposed in saw tooth shape in a common plane and is connected to an external power source (not illustrated) through a connection terminal 5. A heater is incorporated in substrate holder 3 to heat substrate 7 to a predetermined temperature. A shutter 6 is disposed between substrate holder 3 and heating element 4, and will retreat from the position over substrate when the film deposition is made.

Next, the continuous film formation method is explained of silicon nitride film on a GaAs substrate. As shown in FIG. 2, the apparatus which is used to continuously deposit a thin film on a number of substrates is composed of the silicon nitride film forming apparatus 100 shown in FIG. 1, a transfer chamber 200 in which a substrate transfer robot is installed, and a load lock chamber 300 in which substrate holding cassettes are placed. The transfer chamber 200 is connected to film forming apparatus 100 and load lock chamber 300 through gate valves 400 and 400', respectively. In such an apparatus, the lower inner wall has a hole (or a slit) which the robot arm with the substrate can pass through.

The vacuum vessel 1 is exhausted to $10^{-5}$ to $10^{-6}$ Pa by the exhaust system (not illustrated) connected to exhaust port 2. Then, the electric current is supplied to the heater incorporated in the substrate holder. After shutter 6 is opened, the electric current is supplied to heating means of inner wall 11 and heating element 4 to heat to respective predetermined temperatures. The inner wall is heated to, for example, 170° C. In this preheating treatment, the heating element is usually heated to a deposition temperature (about 1600-1900° C. in the case of silicon nitride film) or 50-100° C. higher and heating means of inner wall 11 is adjusted so that the temperature of inner wall becomes 170° C. When stainless steel is employed as material of inner wall, chromium may precipitate if heated to high temperature and contaminate the GaAs substrate to deteriorate device characteristics. Therefore, the temperature of inner wall should not be higher than 300° C., and is preferably 200° C. or lower. In addition, for example $H_2$ gas may be introduced at a predetermined flow rate during the preheating treatment.

Then, the electric current to the heating element is cut off, and the shutter is closed. After that, a substrate 7 is taken out of the cassette in load lock chamber 300 to place on substrate holder 3 by the transfer robot through the hole. After substrate 7 is heated to a predetermined temperature, the raw material gas composed of $SiH_4$, $NH_3$, and $H_2$ is introduced at a predetermined flow rate into the film formation space through gas introduction pipe 8. The pressure is controlled to a predetermined value (for example, 0.1-10 Pa) with the aid of an automatic pressure controller (APC) (not illustrated) attached in exhaust port 2, and then the electric current is supplied to the heating element. Then, shutter 6 is opened. The raw material gas is emitted from gas introduction pipe 8 toward first inner wall 9a, and collides with the wall surface to be scattered in all directions. The raw material gas is decomposed and/or activated on the surface of heating element and/or in its vicinity. The activated species thus generated diffuses toward the substrate surface to begin the film deposition.

After a predetermined period, the shutter 6 is closed and the electric current to the heating element is cut off to finish the film deposition. The processed substrate is taken and returned to the cassette by the transfer robot. A new substrate is taken out of the cassette and placed on the substrate holder to begin another film formation in the same manner as mentioned above.

When the above-mentioned operation is repeatedly carried out, the temperature of inner wall gradually rises by the radiant heat from heating element 4. Therefore, the temperature should be always maintained within a predetermined range ( for example, preferably 170-180° C. or 180-190° C.) by adjusting the coolant flow rate (or temperature) of cooling mechanism 12 and/or heating means 11.

Although the electric current is supplied to the heating element only during film deposition in the embodiment, the electric current may always be supplied throughout processing.

Then, the experiments were made to repeatedly deposit the silicon nitride film on a number of substrates and to investigate the reproducibility of the film thickness and film quality, which will be described below.

In the experiments, the film formation was repeated three times each batch and five batch treatments were carried out. The preheating treatment was made before the first batch. The electric current to the heating element and the heater of inner wall was cut off between batches, while electric current continued to be supplied to the heater incorporated in the substrate holder even between batches. The interval between the 4th and the 5th batch was 30 minutes, and the other intervals were 60 minutes. The film thickness and refractive index of silicon nitride films thus deposited are shown in Table 1. Here, the film thickness and refractive index of silicon nitride films were measured with the aid of an ellipsometer.

In the experiments, as a heating element, a tungsten wire having a diameter of 0.5 mm was fixed on a rectangular frame (215×208 mm) in zigzag configuration (five turns). The inside diameters of the lower part of first inner wall and of the central part of second inner wall were set to 350 mm and 310 mm, respectively. The distances from the heating element plane to the first inner wall and to the substrate were set to 126 mm and 75 mm, respectively. The radius of curvature R of first inner wall was set to 350 mm. The inner walls were maintained in the range of 170-180° C. at the beginning of and during the film deposition.

TABLE 1

| Batch No. | Substrate No. | Temperature* (° C.) | Film thickness (nm) | Refractive index |
|---|---|---|---|---|
| 1 | 1 | 170 | 54.47 | 2.0278 |
|   | 2 | 170 | 54.02 | 2.0284 |
|   | 3 | 170 | 54.34 | 2.0277 |
| 2 | 1 | 170 | 54.31 | 2.0274 |
|   | 2 | 170 | 54.09 | 2.0273 |
|   | 3 | 170 | 54.41 | 2.0251 |
| 3 | 1 | 170 | 54.18 | 2.0253 |
|   | 2 | 170 | 54.22 | 2.0240 |
|   | 3 | 170 | 54.77 | 2.0215 |
| 4 | 1 | 170 | 54.32 | 2.0263 |
|   | 2 | 170 | 54.24 | 2.0257 |
|   | 3 | 170 | 54.42 | 2.0245 |
| 5 | 1 | 170 | 54.02 | 2.0232 |
|   | 2 | 170 | 53.94 | 2.0232 |
|   | 3 | 170 | 54.02 | 2.0240 |

*Temperature of inner wall at the start of film deposition

The conditions of film formation and preheating are as follows:

(Film Formation Condition)

Pressure: 5 Pa $SiH_4$ flow rate: 1 sccm $NH_3$ flow rate: 100 sccm

Electric power supplied to (and the temperature of) heating element: 579.6 W (1800° C.)

Temperature of substrate holder: 275° C.

Film formation time: 7 minutes (Preheating Condition)

Pressure: 5 Pa $H_2$ flow rate: 80 sccm

Electric power supplied to (and the temperature of) heating element: 579.6 W (1800° C.)

Temperature of substrate holder: 275° C.

Preheating processing time: 30 minutes

In order to make comparison with the prior art, the film formation was also carried out without preheating the inner wall or controlling the inner wall temperature. That is, the film formation was made without using heating means or cooling means of inner wall. The results are shown in Table 2, together with the inner wall temperature at the beginning of film deposition.

TABLE 2

| Substrate No. | Temperature* (° C.) | Film thickness (nm) | Refractive index |
| --- | --- | --- | --- |
| 1 | 20 | 58.38 | 2.055 |
| 2 | 67 | 58.41 | 2.076 |
| 3 | 91 | 57.69 | 2.067 |
| 4 | 111 | 57.17 | 2.057 |
| 5 | 127 | 55.52 | 2.056 |
| 6 | 138 | 56.10 | 2.042 |
| 7 | 145 | 54.64 | 2.044 |
| 8 | 154 | 53.87 | 2.044 |
| 9 | 155 | 53.93 | 2.039 |
| 10 | 158 | 53.98 | 2.033 |
| 11 | 161 | 54.19 | 2.029 |
| 12 | 163 | 54.26 | 2.029 |

*Temperature of inner wall at the start of film deposition

Table 2 shows that the inner wall temperature greatly changes from substrate to substrate in the case where the temperature of inner wall was not controlled, and the refractive index of film (or one quality of film) and the film thickness change from substrate to substrate. That is, when the starting temperature of film deposition was below 170° C., the average and the standard deviation of film thickness were 55.68 nm and 1.73 nm of twelve data, and the average and the standard deviation of refractive index were 2.048 and 0.014. Therefore, it is difficult to form silicon nitride films having a uniform film thickness and quality.

On the other hand, in this embodiment, the temperature of inner wall was controlled and the film deposition was started after the temperature reached to 170° C. The temperature was always maintained within the range of 170-180° C. From the samples of five batches (each batch having three samples) made with the interval of 60 minutes (or 30 minutes), the average film thickness was 54.23 nm, and the standard deviation was 0.03-0.27 nm in each batch and 0.20 nm from batch to batch, as is apparent from Table 1. The average of refractive index was 2.025, and the standard deviation was 0.0003-0.001 in each batch and 0.002 from batch to batch. Thus, the films with a uniform thickness and refractive index were stably obtained. That is, the films having a desired quality and thickness can be formed by controlling the temperature of inner wall (namely, the temperature around the heating element and substrate surface) during the deposition, and the reproducibility of the film quality and thickness are improved by maintaining the inner wall at constant temperature. Furthermore, the silicon nitride films formed with the abovementioned experimental conditions have an excellent barrier characteristic and a suitable stress as a passivation layer of a GaAs substrate.

While this invention has been described as having an exemplary design, the present invention may be further modified within the sprit and scope of this disclosure. For example, the heating element, in this invention, may be used in a variety of shapes such as a wire, rod, plate, tube, foil and the like. In addition, the wire may be further formed into coil or saw tooth shape on a rectangular frame, a ring frame or the like.

As has been mentioned, the present invention is characterized in that the inner wall is arranged surrounding the heating element and the substrate, and is controlled to a predetermined temperature, and therefore makes it possible to reproducibly form thin films having a uniform film quality and thickness and to realize a silicon nitride film forming apparatus and a forming method which can carry out stable film formation. That is, the present invention contributes to stable production of high-function devices.

The invention claimed is:

1. A method of forming a silicon nitride film on a substrate, the method comprising:

providing a vacuum vessel chamber that includes an inner wall forming a film formation space in the vacuum vessel, a heating element, and a substrate holder, wherein the substrate holder and the heating element are arranged within the film formation space; the inner wall is thermally isolated from the vacuum vessel, and the temperatures of the inner wall and of the vacuum vessel are independently controlled;

heating the inner wall to a predetermined temperature;

maintaining a temperature of the inner wall to the predetermined temperature with a heating means and a cooling means arranged at the inner wall;

introducing a raw material gas into the inner film formation space so that both the heating element and the substrate holder are exposed to the raw material gas introduced by the gas supply system; and decomposing or activating the raw material gas at a surface of said heating element and its vicinity to generate activated species and deposit a silicon nitride film on said substrate with said activated species.

2. The method of claim 1, wherein the step of maintaining a temperature of the inner wall includes cooling said inner wall with an annular cooling mechanism disposed at a flange portion of the inner wall.

3. The method of claim 1, wherein a raw material gas includes emitting the raw material gas toward a portion of said inner wall which faces a surface of the substrate being processed.

4. The method of claim 1, wherein the inner wall is made of metal.

5. The method of claim 1, wherein the heating element and the substrate are directly exposed to each other during a film forming operation.

6. The method of claim 5, further comprising opening a shutter arranged between the heating element and the substrate holder during a film forming operation.

7. The method of claim 1, further comprising exhausting gas from the inner film formation chamber with a gas exhaust system.

8. The method of claim 1, wherein the temperature of the inner wall is maintained at the range of 170° C. or more to 180° C. or less.

9. The method of claim 1, wherein the temperature of the inner wall is maintained at the range of 180° C. or more to 190° C. or less.

10. The method of claim 1, wherein the heating element is comprised of refractory metal.

11. A method of forming a silicon nitride film on a substrate, comprising:

providing a vacuum vessel that includes an inner wall forming a film formation space in the vacuum vessel, a heating element, and a substrate holder, wherein the substrate holder and the heating element are arranged within the film formation space; the inner wall is thermally isolated from the vacuum vessel, and the temperatures of the inner wall and of the vacuum vessel are independently controlled;

heating the inner wall to a predetermined temperature;
maintaining a temperature of the inner wall to the predetermined temperature with a heater and an annular cooling passage at the inner wall;
introducing a raw material gas into the film formation space so that both the heating element and the substrate holder are exposed to the raw material gas introduced by the gas supply system; and
decomposing or activating the raw material gas at a surface of said heating element and its vicinity to generate activated species and deposit a silicon nitride film on said substrate with said activated species.

* * * * *

UNITED STATES PATENT AND TRADEMARK OFFICE
CERTIFICATE OF CORRECTION

| | |
|---|---|
| PATENT NO. | : 7,704,556 B2 |
| APPLICATION NO. | : 11/764745 |
| DATED | : April 27, 2010 |
| INVENTOR(S) | : Hitoshi Morisaki et al. |

It is certified that error appears in the above-identified patent and that said Letters Patent is hereby corrected as shown below:

Title Page, Item 73: add --Mitsubishi Denki Kabushiki Kaisha, Chiyoda-ku, Tokyo (JP)--.

Signed and Sealed this
Twenty-first Day of June, 2011

David J. Kappos
*Director of the United States Patent and Trademark Office*